(12) United States Patent
Aritome

(10) Patent No.: US 7,391,654 B2
(45) Date of Patent: Jun. 24, 2008

(54) MEMORY BLOCK ERASING IN A FLASH MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/126,682

(22) Filed: May 11, 2005

(65) Prior Publication Data

US 2006/0256622 A1 Nov. 16, 2006

(51) Int. Cl.
*G11C 11/34* (2006.01)
*G11C 16/04* (2006.01)

(52) U.S. Cl. .............................. 365/185.29; 365/185.22
(58) Field of Classification Search ............ 365/185.29, 365/185.22
See application file for complete search history.

(56) References Cited

U.S. PATENT DOCUMENTS

| | | | |
|---|---|---|---|
| 5,526,309 A | 6/1996 | Jinbo | |
| 5,596,530 A | 1/1997 | Lin et al. | |
| 5,814,854 A * | 9/1998 | Liu et al. | ..................... 257/315 |
| 6,009,014 A * | 12/1999 | Hollmer et al. | ........ 365/185.22 |
| 6,157,572 A * | 12/2000 | Haddad et al. | ......... 365/185.22 |
| 6,314,027 B1 | 11/2001 | Choi | |
| 6,577,540 B2 | 6/2003 | Choi | |
| 6,842,378 B2 | 1/2005 | Chang | |
| 6,891,756 B2 | 5/2005 | Zink et al. | |
| 6,914,827 B2 | 7/2005 | Choi | |
| 2003/0039146 A1* | 2/2003 | Choi | ..................... 365/185.33 |
| 2003/0043629 A1 | 3/2003 | Tomoeda et al. | |
| 2004/0057306 A1* | 3/2004 | Roohparvar | ................ 365/200 |

* cited by examiner

*Primary Examiner*—Amir Zarabian
*Assistant Examiner*—Kretelia Graham
(74) *Attorney, Agent, or Firm*—Leffert Jay & Polglaze, P.A.

(57) ABSTRACT

The erase and verify method performs an erase operation and an erase verify read operation. If the erase verify read operation fails because unerased memory cells have been found, a normal memory read operation is performed in order to determine which memory cells are still programmed. A selective erase operation is then performed on the memory cells such that only the rows that comprise unerased memory cells undergo additional erase operations.

10 Claims, 12 Drawing Sheets

MEMORY BLOCK ERASING IN A FLASH MEMORY DEVICE

TECHNICAL FIELD OF THE INVENTION

The present invention relates generally to memory devices and in particular the present invention relates to erasing flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

FIG. 1 illustrates a typical prior art erase operation for a block of flash memory. The memory block is first pre-programmed 101 before an erase operation is performed. The memory block is then erased 103. An erase verify read is then performed 105. If the verify operation fails, the erase operation is performed 103. If the erase verify passes, the erase operation has been successfully completed 107.

The memory array to be erased is pre-programmed in order to reduce the chances of the cells going into a depletion mode. As the cells in a flash memory device get erased, they may get erased to the point where they go into depletion and conduct current even when those cells have a gate voltage of 0 V. This affects the reading of all other cells in their respective columns. By pre-programming the memory, the cells start from a known, programmed state and are therefore less likely to go into an overerased depletion state.

The erase operation is conducted to erase the cells to at least a minimum voltage level. FIG. 2 illustrates a simplified schematic diagram of a flash memory block undergoing a typical prior art erase operation. The drain and source connections of the bit lines are all left floating (F) as are the select gate drain transistors and the select gate source transistors. The word lines of the block to be erased are at ground potential. The dotted lines indicate the memory cells that are selected during this operation.

The erase verify operation is performed in order to determine the success of the erase operation on each cell of the memory block. A simplified schematic diagram of a flash memory block undergoing a typical prior art erase verify operation is illustrated in FIG. 3. The erase verify operation comprises, at least in part, comparing each cell's erase current to a sense amplifier reference current level. During this operation, all of the word lines of the block are held at 0V while the selected bit lines 301, 302 are biased at $V_{CC}$. A 0V pulse is applied to the unselected bit lines 303. The select gate drain and source transistors are typically at 4.5V that is typically referred to in the art as $V_{pass}$. The dotted lines of FIG. 3 indicate the selected memory cells during this operation.

FIG. 16 shows yet another erase verify operation. This operation biases the word lines of the block at 0V while the bit lines are biased at 0V. The select gate drain and source transistors are typically at $V_{pass}$ of 4.5V. The source line is at $V_{CC}$.

If a column of cells has only one unerased cell after an erase verify, the prior art erase operation applies additional erase pulses to the entire column. This can overstress memory cells in the column that are already erased and do not require additional erase pulses. The overstressing of the cells can increase their failure rate.

For the reasons stated above, and for other reasons stated below which will become apparent to those skilled in the art upon reading and understanding the present specification, there is a need in the art for an erase algorithm that reduces the overstressing of memory cells in a flash memory device.

SUMMARY

The above-mentioned problems with erasing a non-volatile memory device and other problems are addressed by the present invention and will be understood by reading and studying the following specification.

The present invention encompasses a method for erasing a block of memory in a flash memory device. The block of memory has a plurality of memory cells that are organized in columns and rows. The method comprises performing an erase operation on the memory block to be erased. An erase verify read operation is then performed to determine if any unerased cells are present. If one or more memory cells are still programmed, a normal memory read operation is performed in order to determine which memory cells are programmed. A selective erase operation is performed such that only the rows that comprise unerased memory cells experience another erase operation.

Further embodiments of the invention include methods and apparatus of varying scope.

DETAILED DESCRIPTION

Figure 1:
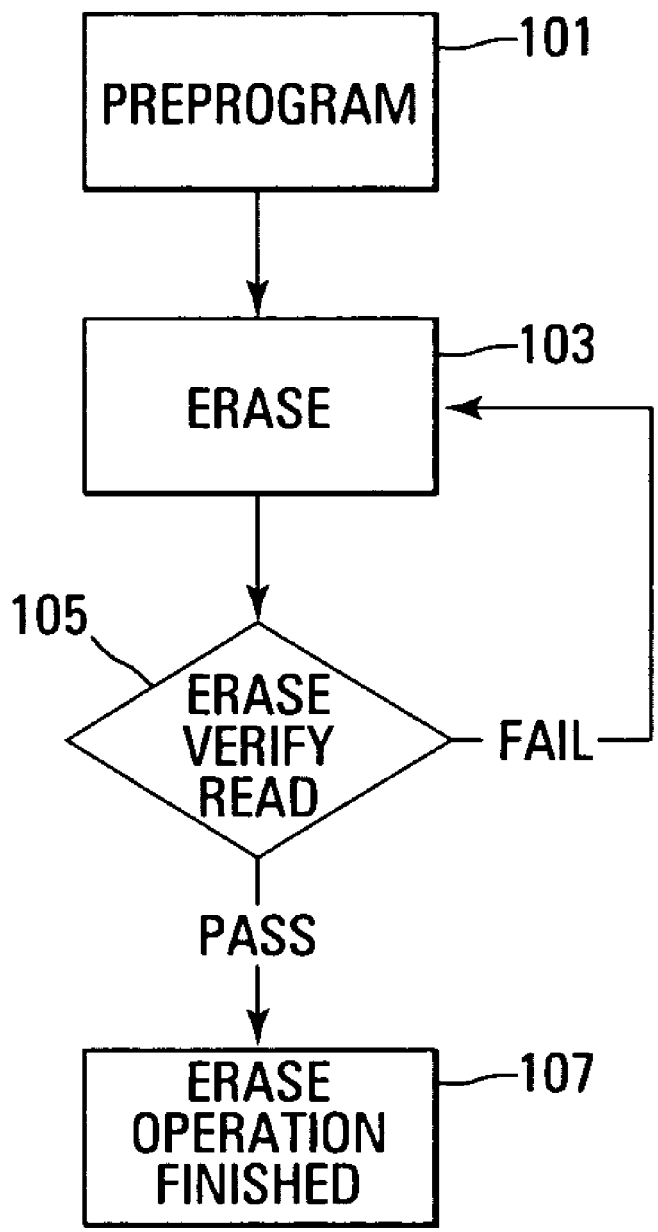
FIG. 1 shows a flowchart of a typical prior art erase and verify operation.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 4:
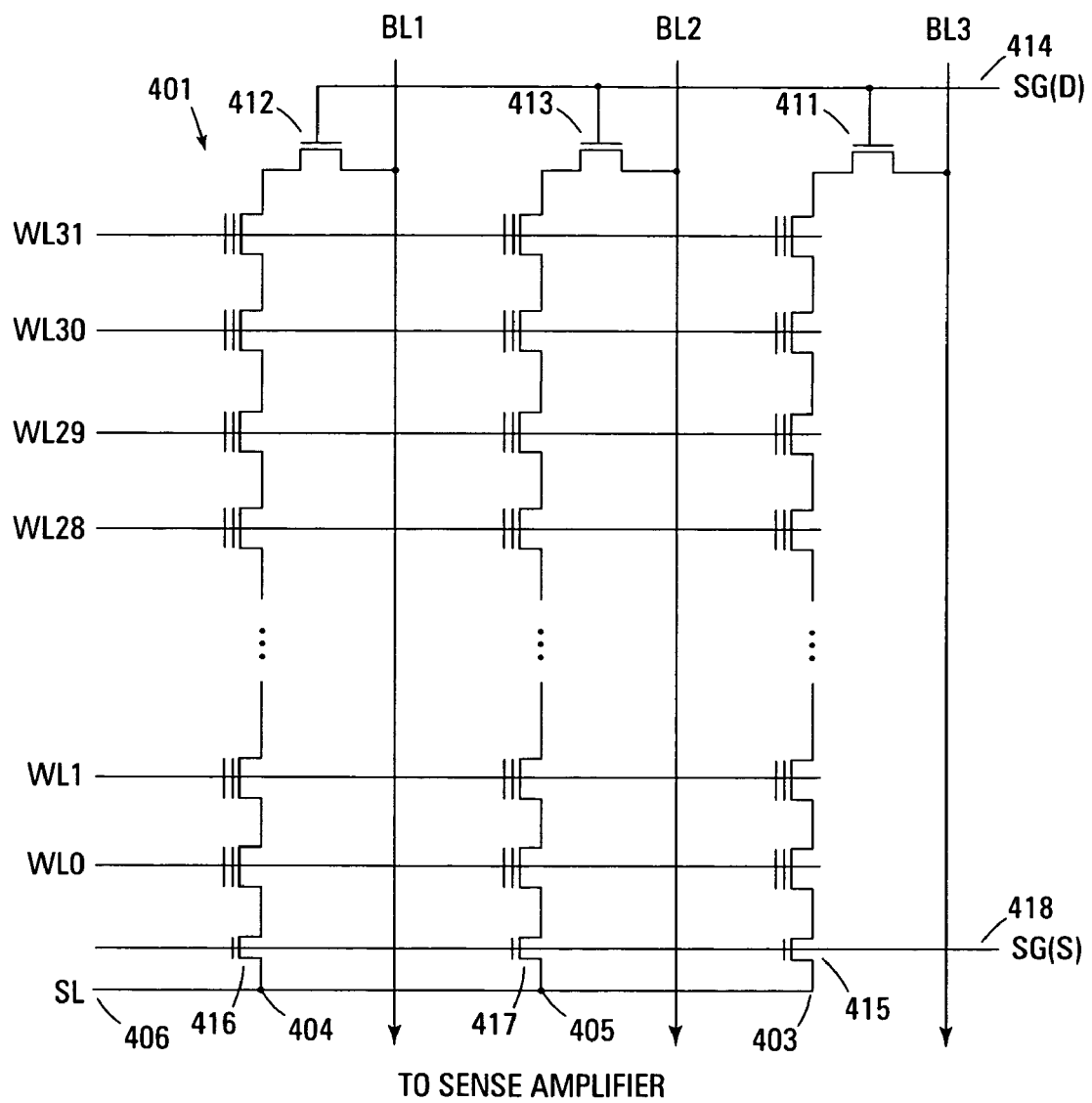
FIG. 4 shows a simplified diagram of a flash memory array of the present invention.

FIG. 4 illustrates a simplified schematic diagram of one embodiment for a NAND flash memory array of the present invention. The memory array of FIG. 4, for purposes of clarity, does not show all of the elements typically required in a memory array. For example, only three bit lines are shown (BL1, BL2, and BL3) when the number of bit lines required actually depends upon the memory density. The bit lines are subsequently referred to as (BL1-BLN).

The array is comprised of an array of floating gate cells 401 arranged in series columns 403, 404, 405. Each of the floating gate cells 401 are coupled drain to source in each series column 403, 404, 405. A word line (WL0-WL31) that spans across multiple series columns 403, 404, 405 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series column 403, 404, 405 to be written to or read from and operate the remaining floating gate memory cells in each series column 403, 404, 405 in a pass through mode. Each series column 403, 404, 405 of floating gate memory cells is coupled to a source line 406 by a source select gate 415, 416, 417 and to an individual bit line (BL1-BLN) by a drain select gate 411, 412, 413. The source select gates 415, 416, 417 are controlled by a source select gate control line SG(S) 418 coupled to their control gates. The drain select gates 411, 412, 413 are controlled by a drain select gate control line SG(D) 414.

Each cell can be programmed as a single bit per cell (i.e., single level cell—SLC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected word line for the flash memory cell to be programmed is biased with a series of programming pulses starting at a predetermined voltage (e.g., approximately 16V) and incrementing until the cell is programmed or a maximum program voltage is reached.

A typical prior art verification operation with a word line voltage of 0V is then performed to determine if the floating gate is at the proper voltage (e.g., 0.5V). The unselected word lines for the remaining cells are typically biased at a voltage that is less than the programming voltage (e.g., approximately 10V) during the program operation. In one embodiment, the unselected word line voltages can be any voltage above ground potential. Each of the memory cells is programmed in a substantially similar fashion.

A memory array of the present invention is broken down into memory blocks. The quantity of memory blocks is typically determined by the size of the memory device (i.e., 512 MB, 1 GB). In one embodiment, each memory block is comprised of 64 pages.

Figure 5:
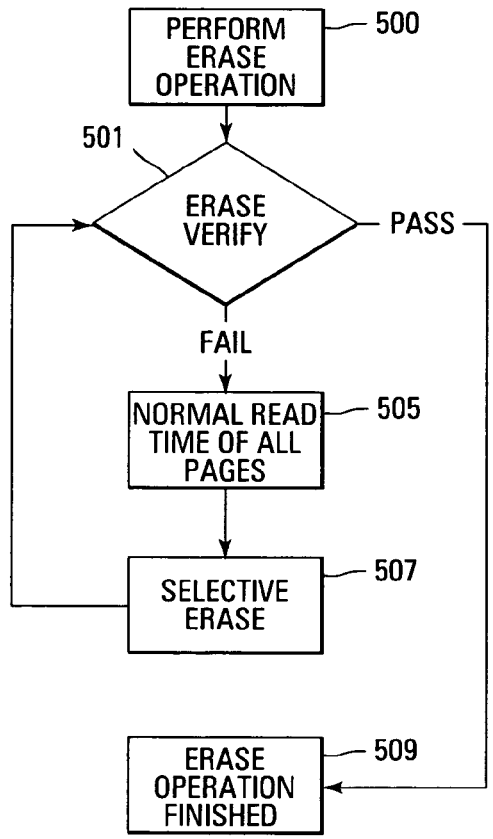
FIG. 5 shows a flowchart of one embodiment of a method of the present invention for an erase and verify operation.

FIG. 5 illustrates a flowchart of one embodiment of the erase and verify operation of the present invention. The erase operation is initially performed 500 on the memory block as described previously.

An erase verify read operation 501 is then performed to determine whether any of the memory cells of the memory block remain programmed. The erase verify operation comprises, at least in part, of comparing each memory array column erase current to a sense amplifier reference current level ($IS_{ref}$) of 30 µA. Alternate embodiments may use other current thresholds for comparison. If the erase verify operation 501 passes, each cell of the block has been successfully erased and the erase and verify operation of the present invention has been completed 509.

If the erase verify read operation 501 has failed, at least one memory cell of the block has not been successfully erased. It should be determined which memory cell or cells have yet to be erased. This is accomplished by performing a normal memory read operation, instead of a verify read, of all the pages 505 of the memory block. In one embodiment, the normal read operation is performed for a normal time period of 10 µs.

Figure 3:
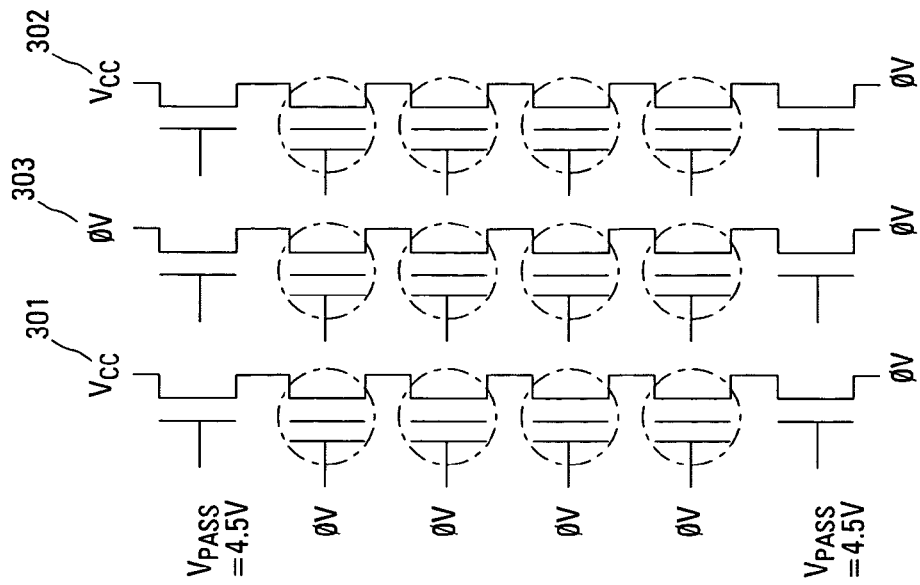
FIG. 3 shows a simplified schematic diagram of a typical prior art flash memory array during an erase verify read operation.
Figure 2:
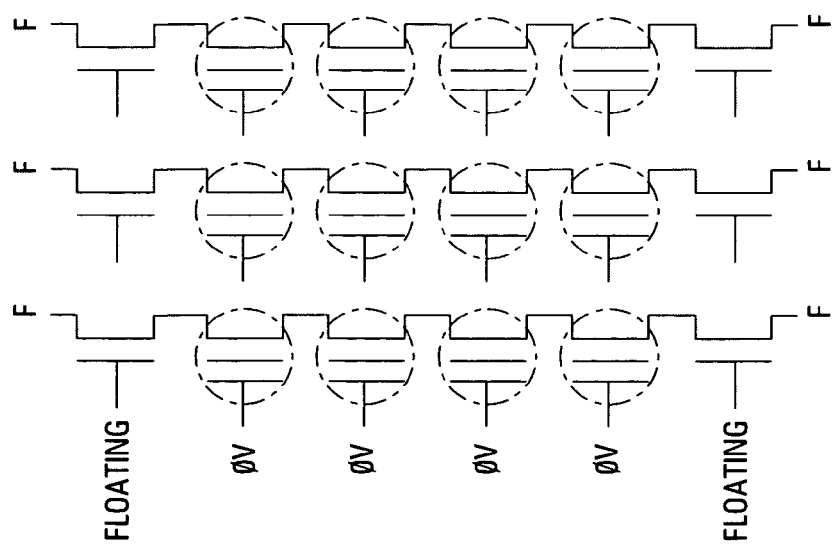
FIG. 2 shows a simplified schematic diagram of a typical prior art flash memory array during an erase operation.

As illustrated in FIG. 3, a typical prior art verify read operation biases all of the word lines of the memory block at 0V. The selected bit lines are then biased at $V_{CC}$ and the unselected bit lines at 0V. This makes it difficult if not impossible to determine which cell has not been erased since entire strings of cells are enabled.

The normal read operation 505 of the present invention biases only a select word line at a read potential such as 0V. In one embodiment, the method begins at the bottom of the array at W0 and increases upward through the memory block to W31. Each word line is read twice since only alternate bit lines are enabled for each read. This operation is illustrated in FIG. 6.

Figure 6:
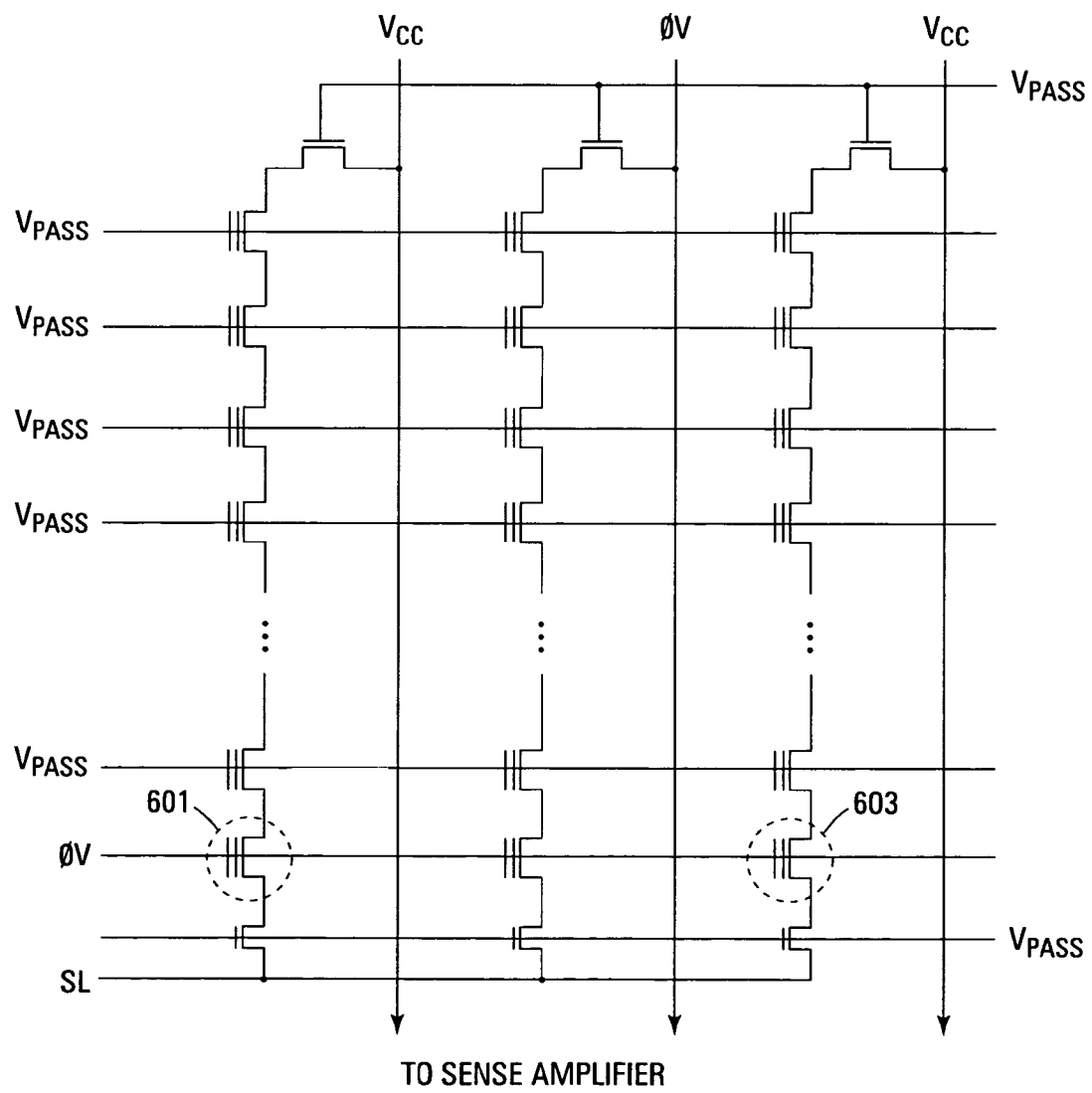
FIG. 6 shows a simplified schematic diagram of the flash memory array during a normal read operation of the present invention.

FIG. 6 illustrates a simplified schematic diagram of the flash memory array during a normal read operation of the present invention. This figure shows that W0 has been selected and, therefore, biased at ground potential. Bit lines 1 and 3 are selected and, therefore, biased at a precharge voltage (e.g., 0V to $V_{CC}$) while bit line 2 is biased at ground potential. This has the effect of selecting the circled memory cells 601, 603. This is repeated until all of the word lines of the block have been read twice. The sense amplifier can thus determine which cell(s) of each row have not been successfully erased.

In the embodiment of FIG. 6, the unselected word lines, the select gate drain, and the select gate source are biased at $V_{PASS}$. In one embodiment, this voltage is 4.5V. Alternate embodiments can use other voltages.

Figure 7:
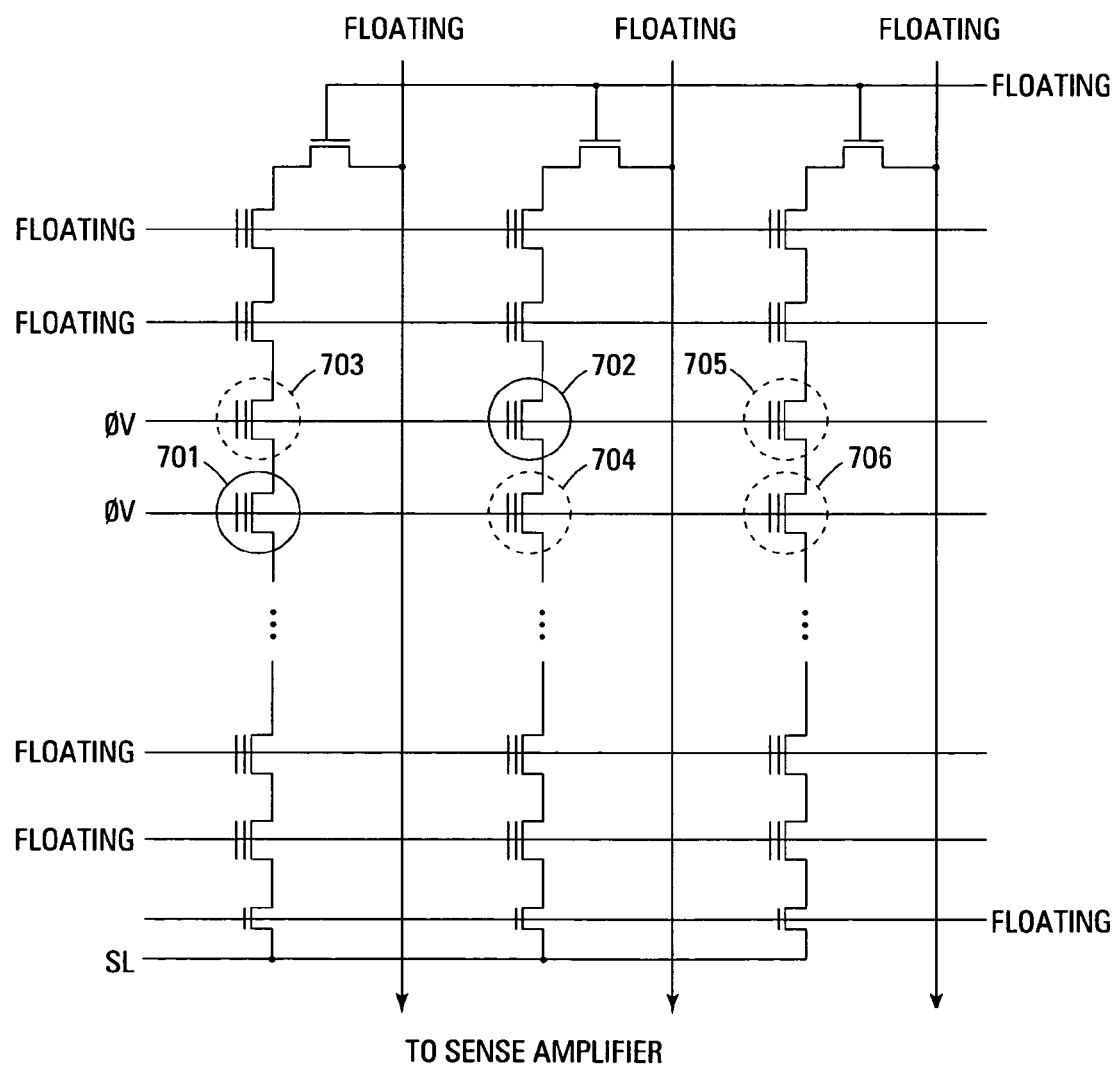
FIG. 7 shows a simplified schematic diagram of the flash memory array during a selective erase operation of the present invention.

Referring again to FIG. 5, a selective erase operation 507 is then performed on those word lines in which un-erased cells are present. This operation is illustrated in greater detail in FIG. 7.

For purposes of illustration, it is assumed that two memory cells 701, 702 have not been erased. In this case, only the two word lines to which the un-erased cells 701, 702 are connected require a second erase operation. Therefore, only the cells 701-706 in those rows experience more erase operations than are necessary to fully erase the memory block. The remainder of the word lines are left floating as are the bit lines and the select gate lines.

After the selective erase operation 507, the erase verify operation 501 is again performed to determine if any cells are still programmed. If all of the cells are erased, the method is completed 509. Otherwise, the method repeats as necessary to completely erase all of the cells in the block.

Figure 8:
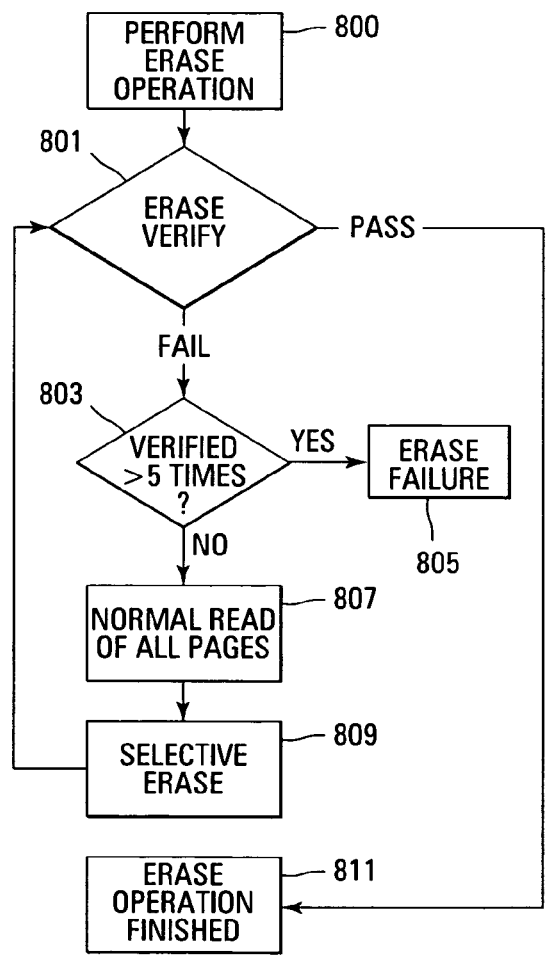
FIG. 8 shows a flowchart of another embodiment of a method of the present invention for an erase and verify operation.

FIG. 8 illustrates a flowchart of an alternate embodiment of the erase and verification method of the present invention. This embodiment is similar to the embodiment of FIG. 5 except that the erase verification is performed only for a limited number of times before an erase failure is declared.

The embodiment starts with an erase operation 800 as described previously. The erase verify operation 801 is then performed. If the verification determines that all of the cells have been successfully erased, the method has been successfully completed 811. If one or more cells are not erased, the erase verify 801 has failed.

In this case, it is determined if the memory block has been verified a predetermined quantity of times 803. In one embodiment, the predetermined quantity of times is five. However, the present invention is not limited to this number of verifications.

If less than the predetermined quantity of verifications has been performed 803, a normal read of all the pages is done 807. As in the previous embodiment, this determines which rows need to go through a selective erase operation 809. If the selective erase operation has not successfully erased the un-erased cells and the quantity of erase verifications is now greater than the maximum threshold of allowed verifications, the erase operation is flagged as a failure 805. This may comprise indicating to the algorithm that initiated the erase and verify operation that a cell is defective so that the particular column coupled to the defective cell can be avoided in future operations.

Figure 9:
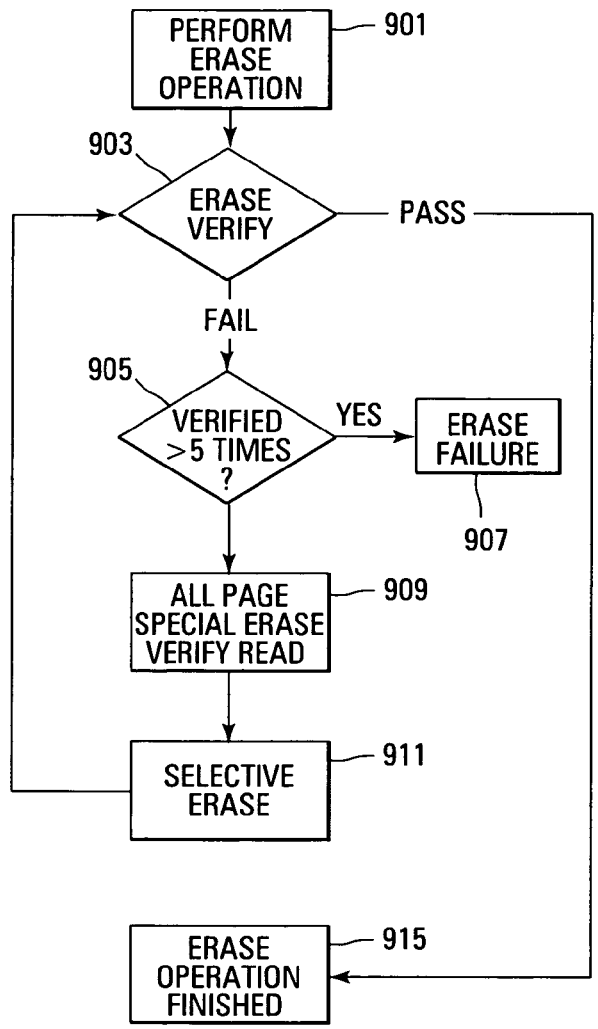
FIG. 9 shows a flowchart of another embodiment of a method of the present invention for an erase and verify operation.

FIG. 9 illustrates yet another embodiment of the erase and verification method of the present invention. This embodiment uses a special page erase verify read operation in addition to the above-described steps.

The method starts when an erase operation is performed 901. An erase verify operation 903 is performed to determine which cell or cells are still programmed. If all of the cells pass the erase verification step 903, the method has been successfully completed 915.

If one or more cells are not erased as determined by the erase verification step 903, the quantity of erase verifications that have been performed is compared to a maximum verification operation threshold. If the erase verification threshold has been reached, an erase failure has occurred 907. In one embodiment, the threshold is five times. However, the present invention is not limited to any one quantity of erase verifications.

If the number of erase verifications performed is still less than the maximum threshold, a special erase verify read operation is performed. This operation is shown in greater detail with reference to FIG. 10.

Figure 10:
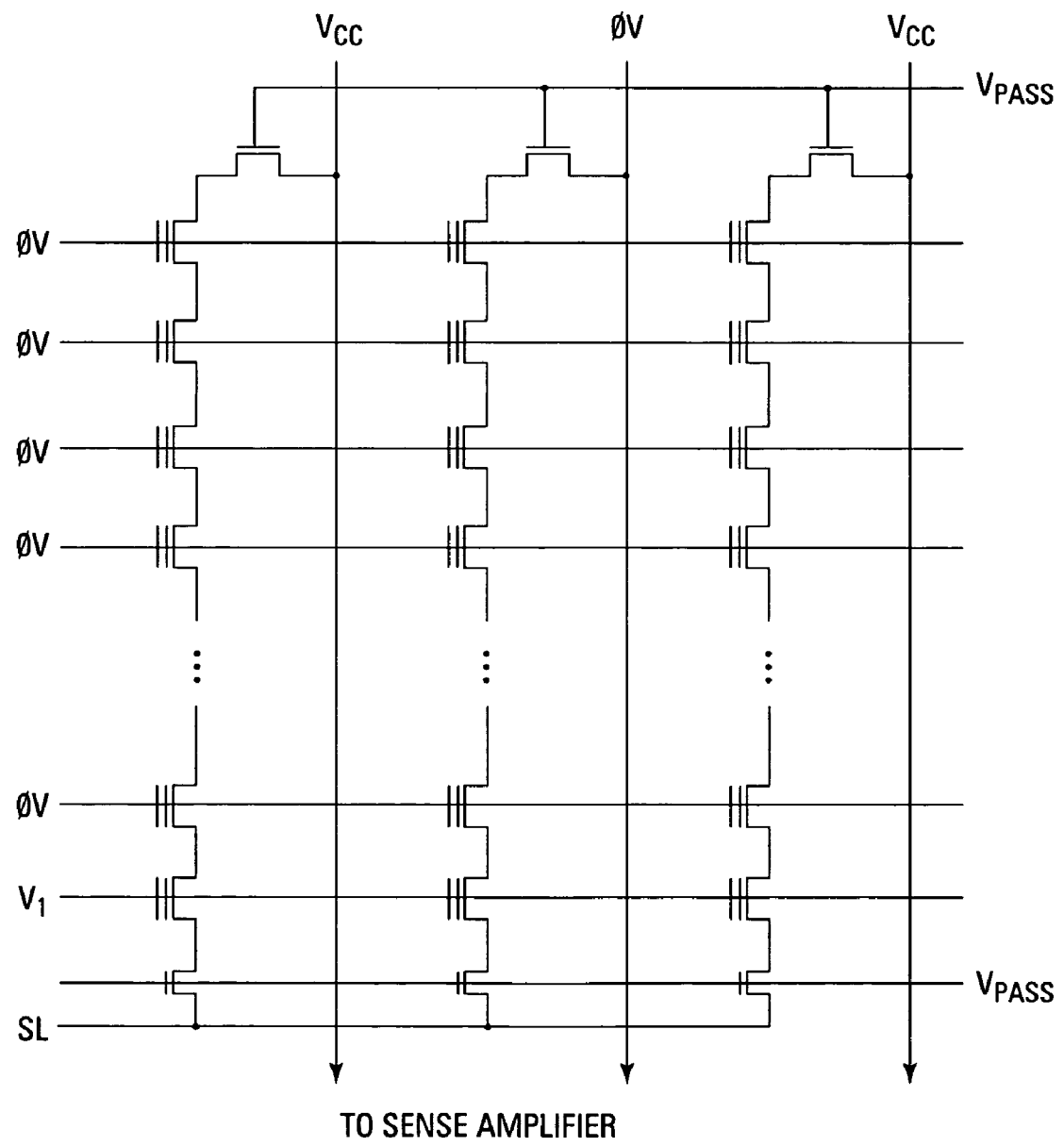
FIG. 10 shows a simplified schematic diagram of the flash memory array during a special page erase verify read operation of the present invention.

FIG. 10 illustrates a simplified schematic diagram of the flash memory array during a special page erase verify read operation of the present invention. This operation is comprised of each unselected word line being biased at ground potential. The selected bit lines are biased at $V_{CC}$ while the unselected bit lines are biased at ground potential. The select gate drain and select gate source lines are biased at $V_{PASS}$ (e.g., 4.5V).

The selected word lines of this embodiment are biased at some voltage, $V_1$, that is less than $V_{PASS}$ and greater than 0V. In one embodiment, this voltage is 1V. However, the present invention is not limited to any one voltage level for $V_1$.

Referring again to FIG. 9, a selective erase operation 911 is performed in order to attempt erasure of the programmed cells. As in previous embodiment, the selective erase step selects only those word lines to which programmed cells are connected. The special erase verify read operation 909 and selective erase operation 911 are repeated until either the cells of the memory block are erased or an erase failure 907 occurs.

Figure 11:
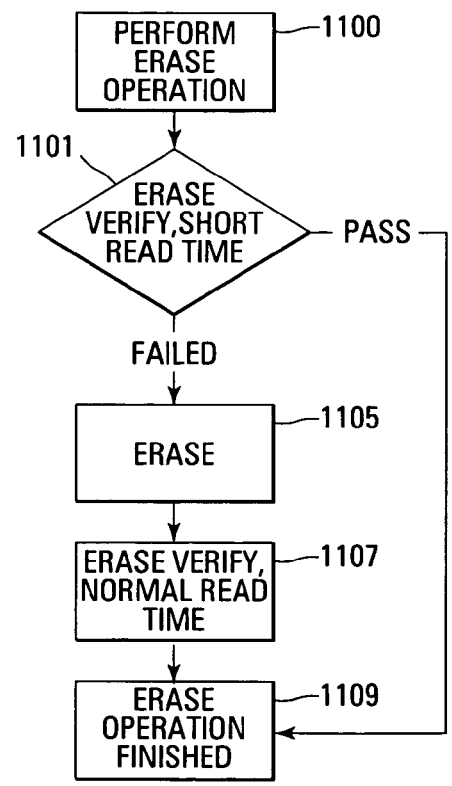
FIG. 11 shows a flowchart of another embodiment of a method of the present invention for an erase and verify operation.

FIG. 11 illustrates a flowchart of yet another embodiment of the erase and verify method of the present invention. This embodiment utilizes different times for the erase verify read operations.

The erase operation is performed 1100 in order to erase the memory block. An erase verify read operation is then performed 1101 to determine if any of the memory cells in the block are still programmed. This erase verify read operation is comprised of a shorter read operation than normal. A normal read operation is approximately 10 µs. In one embodiment, the short erase verify read operation of the present invention is 5 µs but any time less than the normal read operation time could also work. The shorter read time is able to detect erase failures easier than longer read times since the shorter times can detect smaller margins.

If all of the memory cells have been erased, the erase and verify operation has been successfully completed 1109. If programmed memory cells were detected by the short erase verify read operation 1101, another erase operation is performed 1105. An erase verify read operation with a normal read time is then performed 1107. The erase and verify operation is then completed 1109.

The normal and short erase verify read times as described in this and other embodiments of the present invention are for purposes of illustration only. The present invention is not limited to 10 µs for the normal read time and 5 µs for the short read time. The only limitation is that the short read time is performed in less time than the normal read time.

Figure 12:
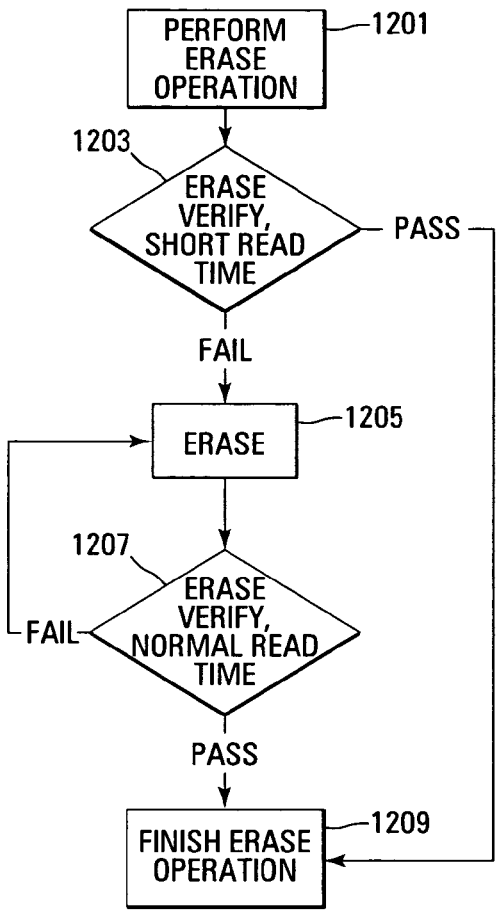
FIG. 12 shows a flowchart of another embodiment of a method of the present invention for an erase and verify operation.

FIG. 12 illustrates a flowchart of another embodiment of a method of the present invention for the erase and verify operation. The erase operation is performed 1201 to erase the memory cells of the memory block. An erase verify with a short read time is then performed 1203. If this operation passes, all of the memory cells in the block have been successfully erased and the operation ends 1209.

If the erase verify with short read operation has failed, programmed cells remain in the block and an erase operation is then performed 1205. An erase verify with a normal verify read operation is then done 1207 to determine if the erase operation 1205 was successful. If not, the erase operation 1205 and normal verify read operation 1207 are repeated until the programmed cells are erased and the verify 1207 passes.

Figure 13:
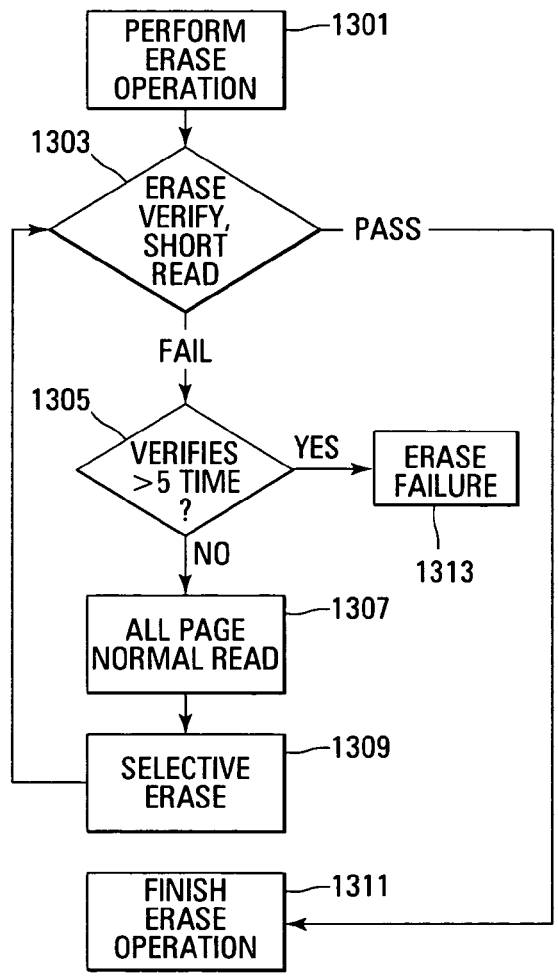
FIG. 13 shows a flowchart of another embodiment of a method of the present invention for an erase and verify operation.

FIG. 13 illustrates a flowchart of yet another embodiment of a method of the present invention for the erase and verify operation. The erase operation is performed 1301 to erase the memory block. An erase verify operation with short read time 1303 is then performed to determine which, if any, of the memory cells are still programmed. If none are still programmed, the operation has been completed 1311.

If one or more memory cells are programmed 1303, the number of erase verify operations is compared to a threshold 1305 of maximum erase verify operations to perform. In one embodiment, this threshold is five times. However, the present invention is not limited to any one quantity of erase verify operations.

If the threshold of erase verifies has been met or exceeded, the erase operation has been a failure 1313. If the threshold has not been met 1305, a normal memory read operation is performed 1307 on all of the pages of the memory block. As discussed previously, the normal memory read operation is different from the verify read operation in that only a selected word line is biased at ground potential instead of all of the word lines as done in a verify read.

A selective erase operation 1309 is then performed on each row that was found to contain a memory cell that is still programmed. The method then repeats from performing the erase verify operation with a short read time 1303 until either the memory cell or cells have been erased or the threshold for maximum quantity of verifies to be performed has been met or exceeded.

Figure 14:
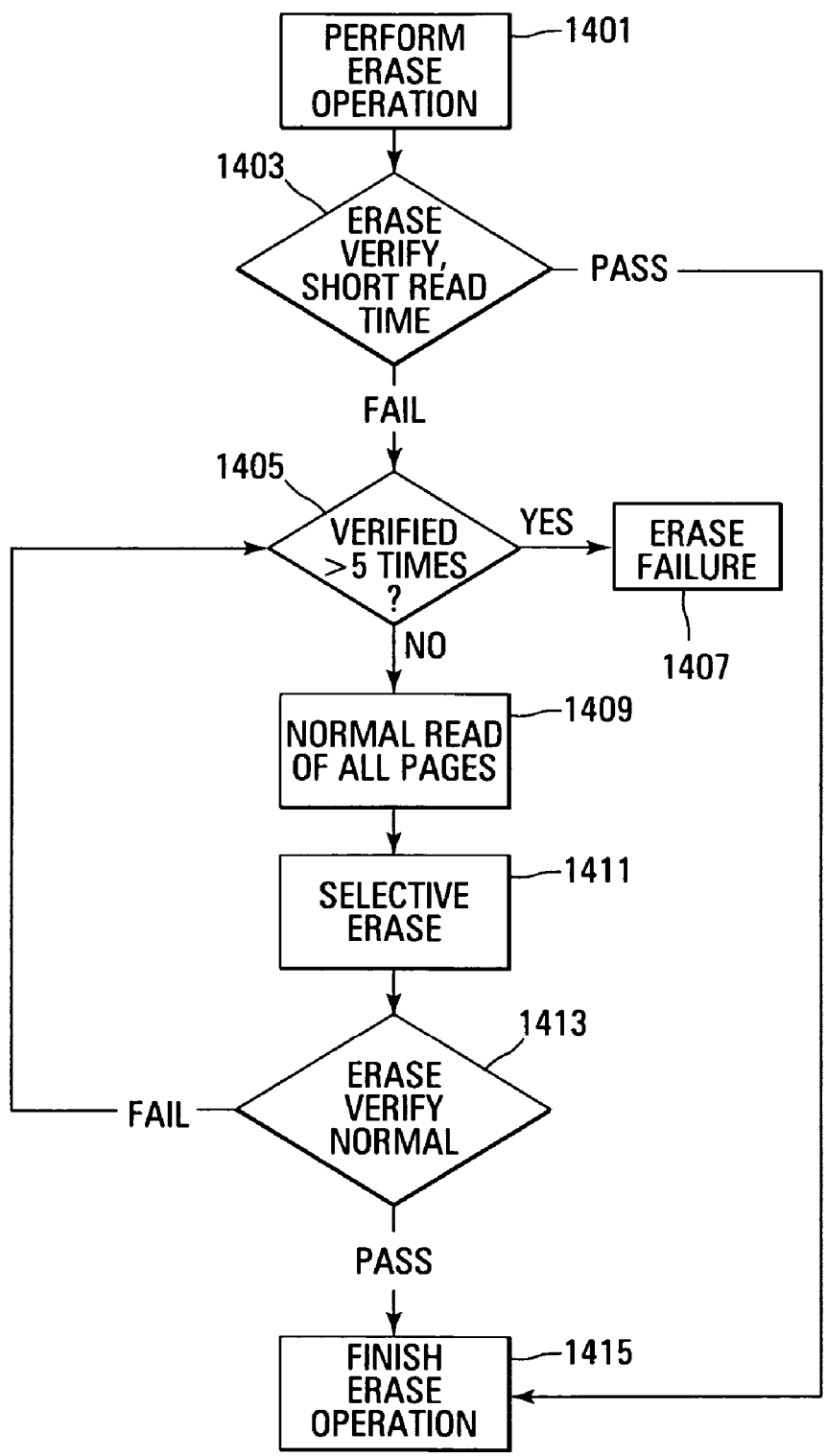
FIG. 14 shows a flowchart of another embodiment of a method of the present invention for an erase and verify operation.

FIG. 14 illustrates a flowchart of still another embodiment of a method of the present invention for the erase and verify operation. The erase operation is performed 1401 to erase the memory cells of the block. An erase verify operation with a short read time is then performed 1403 to find any remaining cells that are still programmed. If all cells have been programmed, the operation has been successfully completed 1415.

If one or more cells have been found to be still programmed, the number of verify operations performed is compared to a threshold for maximum quantity of verify operations 1405. In one embodiment, this threshold is five time but alternate embodiments can use other thresholds.

If the number of verify operations performed has met or exceeded this threshold 1405, an erase failure 1407 has occurred. If the number of verify operations has not been met, a normal read operation is performed on all of the pages of the memory block 1409 to find the particular cells that are still programmed.

A selective erase operation is then performed 1411 on the word lines coupled to the cells that are still programmed. An erase verify operation with a normal memory read operation is then performed 1413. If this erase verify passes, the method has been successfully completed 1415. If the erase verify operation 1413 finds that one or more cells are still un-erased, the method repeats from performing the normal read operation on all of the pages 1409 until either the cells are erased or an erase failure has occurred 1407.

Figure 15:
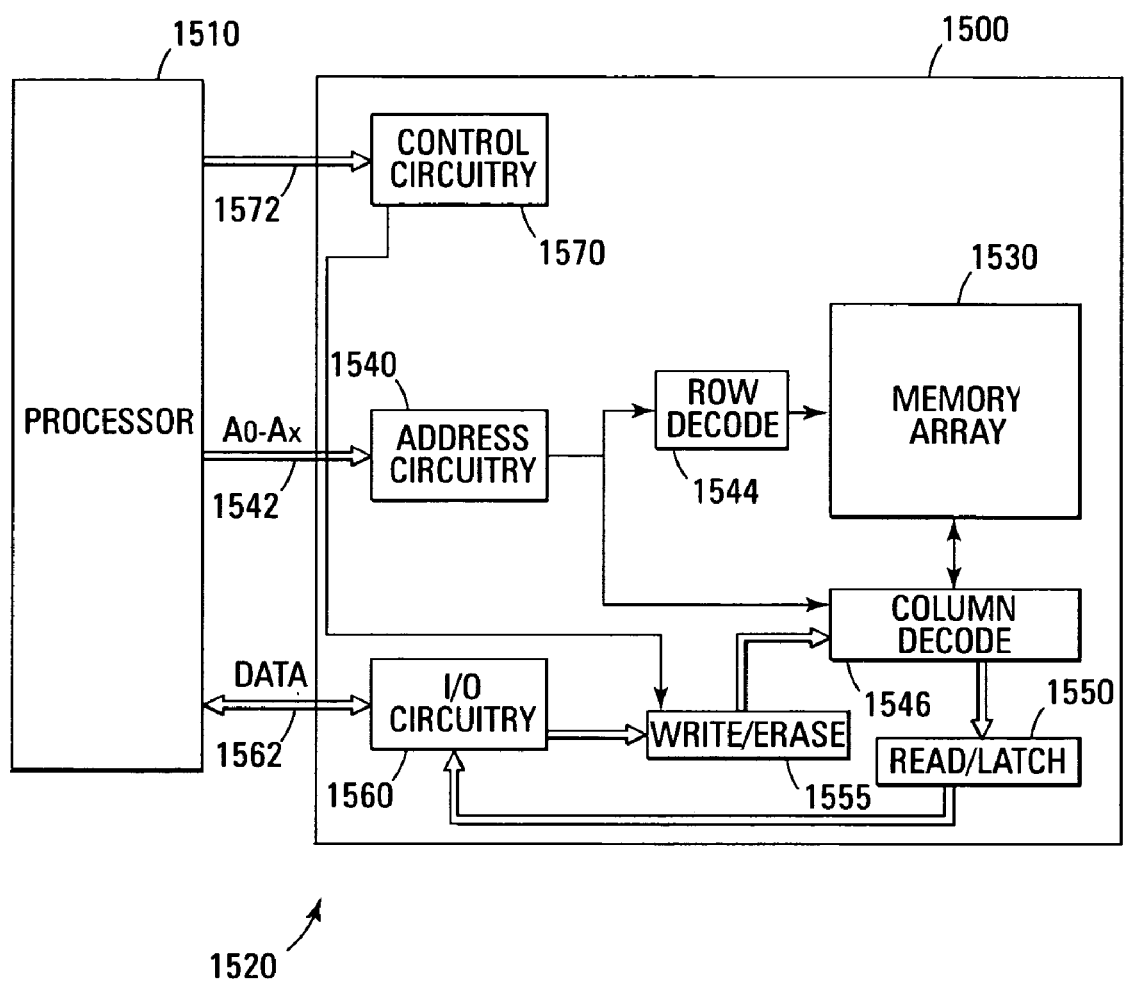
FIG. 15 shows a block diagram of one embodiment of an electronic system of the present invention.
Figure 16:
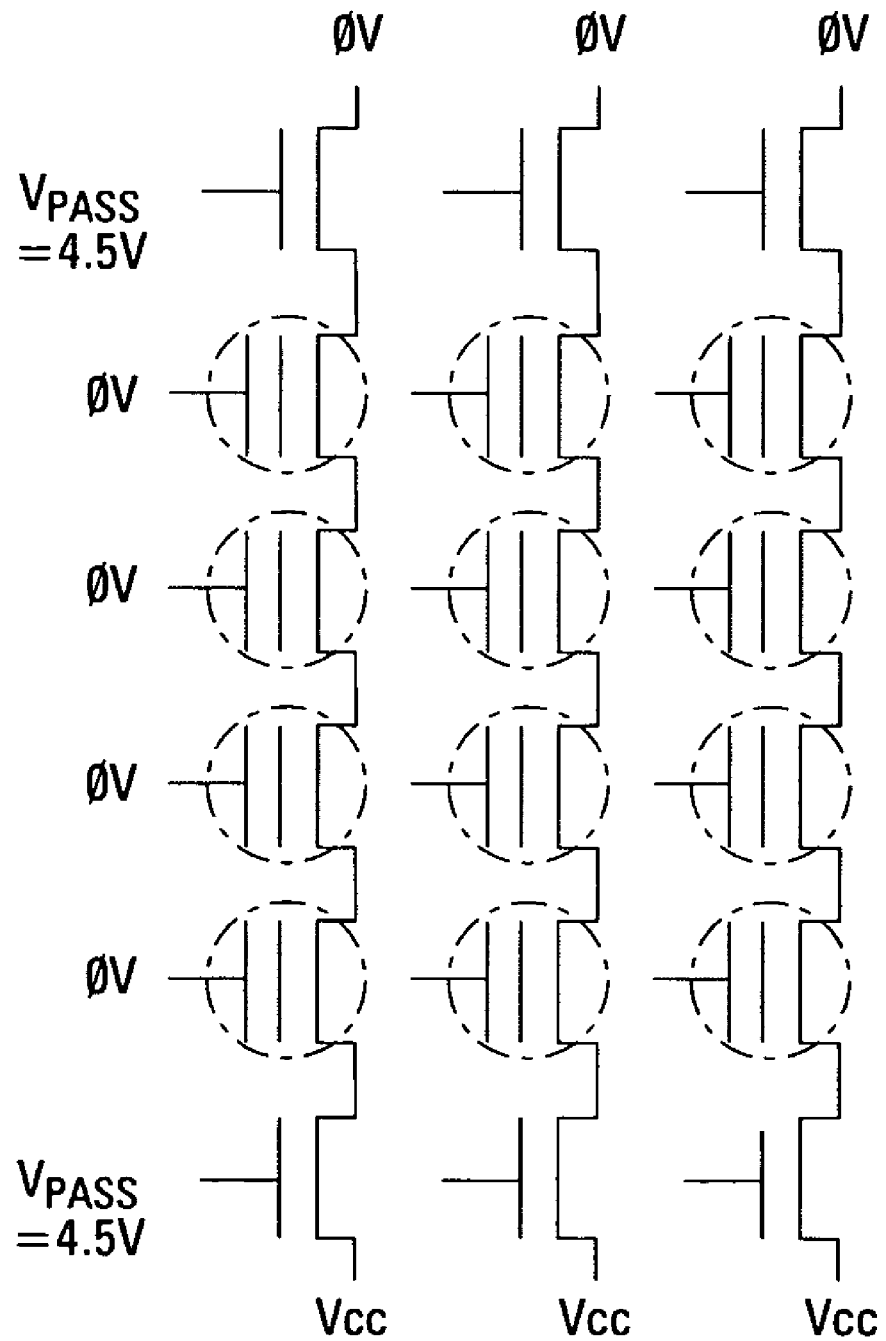
FIG. 16 shows a simplified schematic diagram of a typical prior art flash memory array during an erase verify read operation.

FIG. 15 illustrates a functional block diagram of a memory device 1500 of one embodiment of the present invention that is coupled to a processor 1510. The processor 1510 may be a microprocessor, a processor, or some other type of controlling circuitry. The memory device 1500 and the processor 1510 form part of an electronic system 1520. The memory device 1500 has been simplified to focus on features of the memory that are helpful in understanding the present invention.

The memory device includes an array of memory cells 1530. In one embodiment, the memory cells are non-volatile floating-gate memory cells and the memory array 1530 is arranged in banks of rows and columns.

An address buffer circuit 1540 is provided to latch address signals provided on address input connections A0-Ax 1542. Address signals are received and decoded by a row decoder 1544 and a column decoder 1546 to access the memory array 1530. It will be appreciated by those skilled in the art, with the benefit of the present description, that the number of address input connections depends on the density and architecture of the memory array 1530. That is, the number of addresses increases with both increased memory cell counts and increased bank and block counts.

The above-described embodiments have focused on a NAND architecture memory array. However, the present invention is not limited to this architecture. The embodiments of the memory block erase method of the present invention can be used in any architecture of memory device (e.g., NAND, NOR, AND).

The memory device 1500 reads data in the memory array 1530 by sensing voltage or current changes in the memory array columns using sense/latch circuitry 1550. The sense/latch circuitry, in one embodiment, is coupled to read and latch a row of data from the memory array 1530. Data input and output buffer circuitry 1560 is included for bi-directional data communication over a plurality of data connections 1562 with the controller 1510). Write circuitry 1555 is provided to write data to the memory array.

Control circuitry 1570 decodes signals provided on control connections 1572 from the processor 1510. These signals are used to control the operations on the memory array 1530, including data read, data write, and erase operations. In one embodiment, the control circuitry 1570 executes the erase methods of the present invention. The control circuitry 1570 may be a state machine, a sequencer, or some other type of controller.

The flash memory device illustrated in FIG. 15 has been simplified to facilitate a basic understanding of the features of the memory. A more detailed understanding of internal circuitry and functions of flash memories are known to those skilled in the art.

CONCLUSION

In summary, an improved erase process of the present invention reduces the overerase stress experienced by flash memory cells. This increases the reliability and lifespan of the memory device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a flash memory device comprising a plurality of memory blocks, each memory block having a plurality of memory cells organized in columns and rows, the method comprising:

performing an erase operation on a first memory block;

determining if any of the plurality of memory cells of the first memory block is unerased by performing an erase verification operation that comprises biasing all of the rows of the first memory block substantially simultaneously with an erase verify read potential; and performing a selective erase operation only on rows comprising an unerased memory cell in response to a normal memory read operation that determines which memory cells of the first memory block remain unerased wherein the normal memory read operation comprises biasing only a selected row of the first memory block with a normal read potential and biasing the remaining rows of the first memory block at a $V_{PASS}$ voltage that is greater than the normal read potential.

2. The method of claim 1 wherein the selective erase operation comprises biasing, at a predetermined potential, only rows that comprise an unerased memory cell.

3. The method of claim 2 wherein the predetermined potential is ground potential.

4. The method of claim 1 wherein the normal memory read operation comprises individually biasing in turn, at the normal read potential, each of the rows of the first memory block while select columns of the first memory block are biased at a precharge voltage, unselected columns are biased at ground potential, and unselected rows are biased at the $V_{PASS}$ voltage.

5. The method of claim 4 wherein the normal read potential is ground potential and the precharge voltage is in a range of 0V to $V_{CC}$.

6. The method of claim 2 and further including allowing to float all remaining rows and all columns of the memory block during the selective erase operation.

7. A flash memory device comprising:

a memory array having a plurality of memory blocks that are each comprised of a plurality of memory cells arranged in rows and columns; and control circuitry that is adapted to execute a memory erase and verify method comprising performing an erase operation on a first memory block of the plurality of memory blocks, determining if any of the plurality of memory cells of the first memory block is unerased by performing an erase verification operation that comprises biasing all of the rows of the first memory block substantially simultaneously with an erase verify read potential, and performing a selective erase operation only on rows comprising unerased memory cells in response to a normal memory read operation that determines which memory cells remain unerased wherein the normal memory read operation comprises biasing only a selected row of the first memory block with a normal read potential and biasing the remaining rows of the first memory block at a $V_{PASS}$ voltage that is greater than the normal read potential.

8. The flash memory device of claim 7 wherein the memory array is arranged in a NAND architecture.

9. The flash memory device of claim 7 wherein the memory array is arranged in a NOR architecture.

10. A method for erasing a flash memory device comprising a plurality of memory blocks, each memory block having a plurality of memory cells organized in columns and rows, the method comprising:

performing an erase operation on a first memory block;

determining if any of the plurality of memory cells of the first memory block is unerased by performing an erase verification operation; and performing a selective erase operation only on rows comprising unerased memory cells in response to a normal memory read operation that determines which memory cells of the first memory block remain unerased wherein the normal memory read operation biases rows differently than the erase verification operation.

* * * * *